United States Patent
Besling

(10) Patent No.: US 7,928,006 B2
(45) Date of Patent: Apr. 19, 2011

(54) STRUCTURE FOR A SEMICONDUCTOR DEVICE AND A METHOD OF MANUFACTURING THE SAME

(75) Inventor: Wim Besling, Eindhoven (NL)

(73) Assignee: NXP B.V., Eindhoven (NL)

( * ) Notice: Subject to any disclaimer, the term of this patent is extended or adjusted under 35 U.S.C. 154(b) by 537 days.

(21) Appl. No.: 12/066,704

(22) PCT Filed: Sep. 8, 2006

(86) PCT No.: PCT/IB2006/053184
§ 371 (c)(1),
(2), (4) Date: Mar. 13, 2008

(87) PCT Pub. No.: WO2007/031922
PCT Pub. Date: Mar. 22, 2007

(65) Prior Publication Data
US 2008/0251921 A1    Oct. 16, 2008

(30) Foreign Application Priority Data
Sep. 15, 2005  (EP) .................................. 05300749

(51) Int. Cl.
*H01L 23/52* (2006.01)
*H01L 21/4763* (2006.01)

(52) U.S. Cl. ................ 438/643; 438/648; 257/E21.584; 257/E23.141

(58) Field of Classification Search .................. 257/751, 257/E21.584, E23.141; 438/643, 648
See application file for complete search history.

(56) References Cited

U.S. PATENT DOCUMENTS
6,268,288 B1    7/2001  Hautala et al.
2001/0054769 A1    12/2001  Raaijmakers et al.

FOREIGN PATENT DOCUMENTS
EP  0806799 A1    11/1997
WO  02063677 A1    8/2002

*Primary Examiner* — Evan Pert

(57) ABSTRACT

There is described a method of manufacturing a damascene interconnect (1) for a semiconductor device. A non conductive diffusion barrier (10) is formed over the wall(s) of a passage (7) defined by a porous low K di-electric material (6) and over the surface of a copper region (3) that closes one end of the passage (7). The non-conductive barrier layer (10) is plasma treated to transform an upper portion thereof (10*b*) into a conductive layer, while a low portion thereof (10*a*) comprising material that has penetrated pores of the di-electric material remains non-conductive. The passage (7) is then filled with a second copper region (13) forming an electrical interconnect with the first copper region (3) via the now conductive upper portion (10*b*) of the barrier (10). As a person skilled in the art will know, all embodiments of the invention described and claimed in this document may be combined without departing from the scope of the invention.

24 Claims, 4 Drawing Sheets

STRUCTURE FOR A SEMICONDUCTOR DEVICE AND A METHOD OF MANUFACTURING THE SAME

The present invention relates to a structure, in particular but not exclusively, an interconnect structure for a semiconductor device, and a method of fabricating the structure.

The density of transistors on high performance integrated circuits (Ics) is steadily increasing. The integration of many active elements has necessitated that such ICs feature multiple layers of high density metal interconnects.

Recently, the semiconductor industry has moved away from using aluminum interconnect metal with Silicon Dioxide dielectric between the metal lines, to using Copper metal and low-k dielectric materials.

Copper reduces the resistance of the metal interconnect lines while low-k dielectrics reduce the parasitic capacitance between the metal lines. These new materials have been employed in a fabrication process called "Dual Damascene" which is used to create the multi-level, high density metal interconnections needed for advanced, high performance ICs.

For devices of the 65 nm and beyond generation, the deposition of uniform barriers for Cu interconnections using conventional physical vapour deposition (PVD) becomes problematic in sub 100 nm vias and trenches. Non-conformal PVD barrier deposition creates un-wanted overhangs at the top of vias and trenches. As the diameters of the vias decrease in size, the overhangs will increase in size.

Other problems that may arise due to non-conformal coverage of a barrier are 1) the generation of voids during Cu electroplating, and 2) the limited thickness of the barrier on the side wall enabling rapid diffusion of Cu into the dielectric. Further scaling could eventually result in a discontinuous film on the side wall creating easy copper penetration pathways inside the dielectric and Cu diffusion into the active areas.

Therefore, conformal, continuous, and thin barrier films are needed for complete Cu filling of vias and trenches. One known technique suitable for depositing very conformal barriers is Atomic Layer Deposition (ALD). The ALD technique shows excellent step coverage in very high aspect ratio trenches and vias. Additionally, high quality conductive films can be deposited at low temperature with a low defect density, good thickness uniformity and accurate thickness control. Therefore, ALD is a potentially an ideal method to prepare thin and conformal diffusion barriers or nucleation layers for future IC generations.

However, an additional problem arises when the ALD technique is integrated with porous ultra low-k (ULK) materials. For instance, diffusion of reactants into the ULK dielectric during ALD deposition is a major concern. The ALD process is able to cover the whole inner surface if diffusion takes place. Two approaches have been proposed in literature to prevent diffusion First, it has been proposed that very thin PECVD liners (SiC) be used to block the pores. Secondly, it has been proposed that pores be closed by a plasma treatment (side wall restructuring).

With the first approach a relative thick SiC layer is needed to close all the pores (>10 nm). This, in turn, will increase the overall k-value of the stack and increase the line resistivity due to the reduced line width.

The second approach is based on a sidewall densification process by a proper plasma treatment in such a way that diffusion of reactants is blocked. For materials that have a large porosity and a large pore diameter the amount of material which needs to be restructured/redeposited is not enough to close the surface. An additional problem is the increase of the k-value due to the plasma treatment.

Therefore a new approach is presented here that is based on the deposition of a dielectric barrier that can be later transformed into a metallic barrier by a suitable treatment, for example plasma treatment.

According to the present invention there is provided a method of manufacturing a structure for a semiconductor device, the method comprising: forming a non-conductive barrier layer over a first material; treating the non-conductive barrier layer to transform an upper portion thereof into a conductive layer while a lower portion thereof that underlies the upper portion remains non-conductive.

According to the invention there is also provided a structure for a semiconductor device, the structure comprising: a barrier layer formed on a first material, the barrier layer comprising a lower region comprising an insulating material and an upper region overlying the lower region and comprising a conducting material derived from the insulating material In a preferred embodiment, the structure is a damascene interconnect for a semiconductor device. A non-conductive diffusion barrier is formed over the wall(s) of a passage defined by a porous low K di-electric material and over the surface of a copper region that closes one end of the passage. The non-conductive barrier layer is plasma treated to transform an upper portion thereof into a conductive layer, while a lower portion thereof comprising material that has penetrated and sealed pores of the di-electric material remains non-conductive. The passage is then filled with a second copper region, forming an electrical interconnect with the first copper region via the now conductive upper portion of the barrier.

An embodiment of the invention will now be described by way of example only with reference to the accompanying drawings in which.

Figure 1:
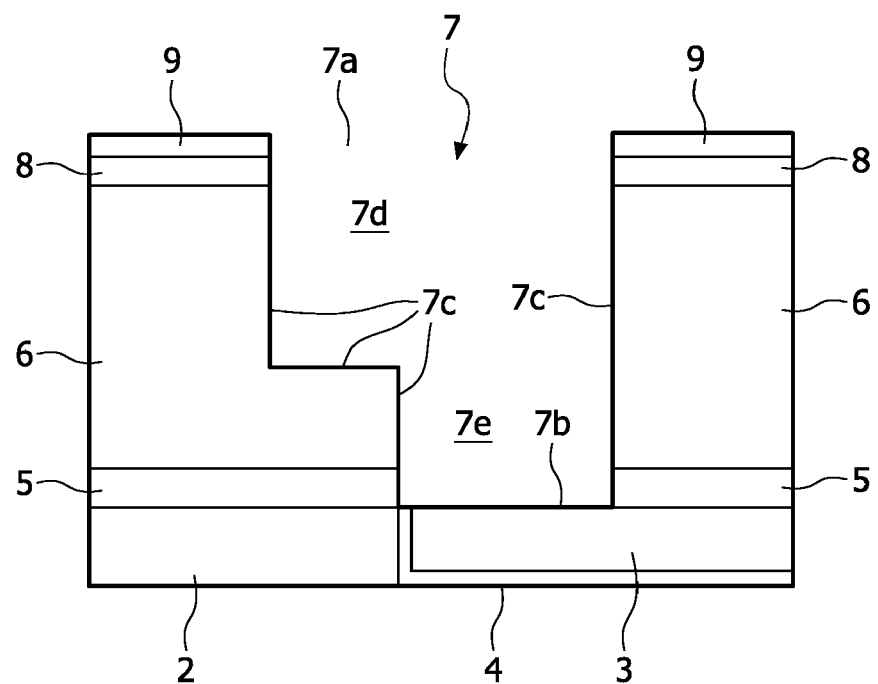
FIGS. 1 to 6 are schematic diagrams of a structure for a semiconductor device.

Referring to FIG. 1 of the accompanying drawings there is illustrated a part formed damascene structure 1. The structure 1 comprises a first dielectric layer 2 formed of ultra low K material adjacent to a first metal layer 3, for example copper. A thin barrier layer 4, for example formed of conductive TaN, separates the dielectric layer 2 and the first metal layer 3.

An etch stop layer 5, for example, formed from SiCN covers the first dielectric layer 2 and partly covers the first metal layer 3.

A second dielectric layer 6 comprising the ultra low K material is formed on the etch stop layer 5. The second dielectric layer 6 contains a passage 7 having an open-end 7a and a closed end 7b closed by the first metal layer 3. The wall(s) 7c of the passage define a first passage portion or trench 7d having the open-end 7a and a second passage portion or via 7e having the closed end or via bottom 7b. The first passage portion 7d is wider than the second passage portion 7e.

A USG hard mask layer 8 is formed on an upper surface of the second dielectric layer 6. A Tin hard mask layer is 9 is formed on the USG hard mask layer 8.

The structure 1 is fabricated using known standard techniques. Briefly, the low k layers are deposited with or without intermediate and top hard masks. Resists are spun and lithographically exposed. The resists are patterned, the hard masks etched and then the resists are removed. The porous low K material and the layer 5 are then etched to form the passageway 7.

Figure 2:
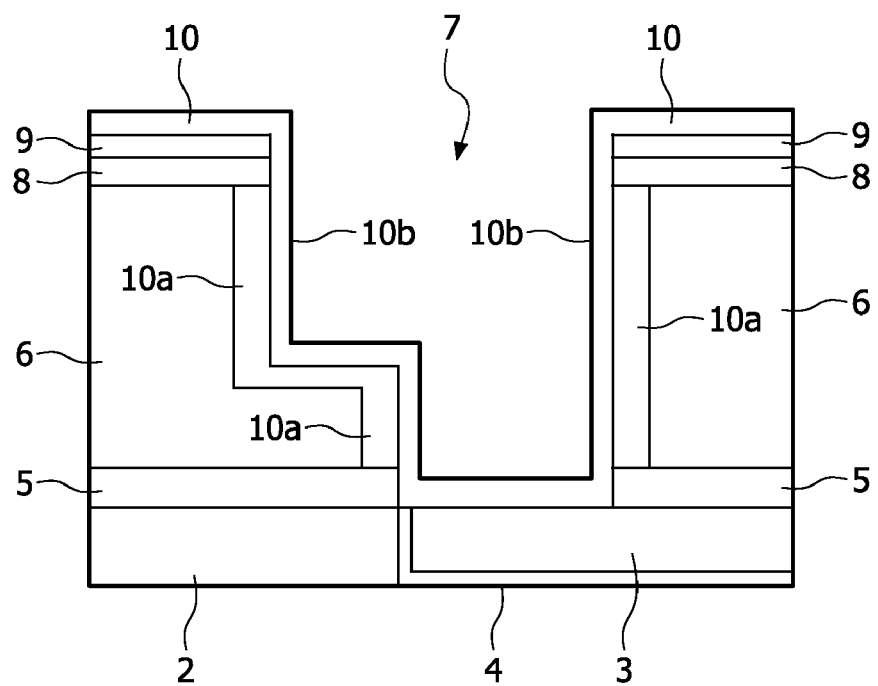
Figure 3:
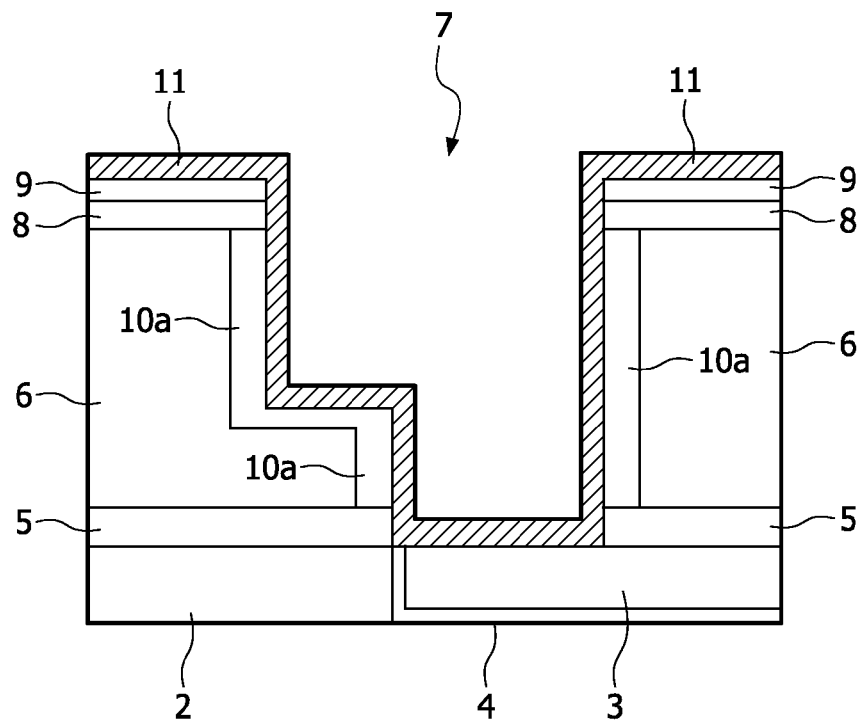

Advantageously, in this embodiment of the invention, the problem of metal deposition within the porous second dielectric layer 6 when forming a barrier layer on the wall(s) of the passage 7 is avoided. To this end, referring now to FIGS. 2 and 3 of the drawings, in order to form a conductive barrier layer 11 (see FIG. 3) on the wall(s) of the passage 7, on the exposed surface of the metal layer 3 and on the surface of the layer, first, a layer 10 (see FIG. 2) of non-conductive material is deposited on these regions. The material that the non-conductive layer 10 comprises is selected so that following its deposition, a suitable treatment process can transform an outer part 10b of the layer 10 into the conductive barrier 11, whilst a lower part 10a comprising material 10 (See FIG. 2) from the non-conducting layer 10 that has penetrated pores of the second dielectric layer 6 remains dielectric.

In a preferred embodiment the non-conductive layer 10 comprises dielectric $Ta_3N_5$ formed by depositing tantalum nitride chemically, for example, using ALD or chemical vapour deposition (CVD).

A soft argon plasma treatment, (example conditions 300 W AC bias for 120 s) is used to bombard the $Ta_3N_5$ non-conductive layer 9 with $Ar^+$ ions to convert the dielectric $Ta_3N_5$ into metallic TaN to form the conductive barrier layer 11. This treatment does not modify $Ta_3N_5$ that has penetrated pores of the second dielectric layer 6 because of the limited penetration depth (typically below 5 nm) of the reactive species in the plasma.

Figure 4:
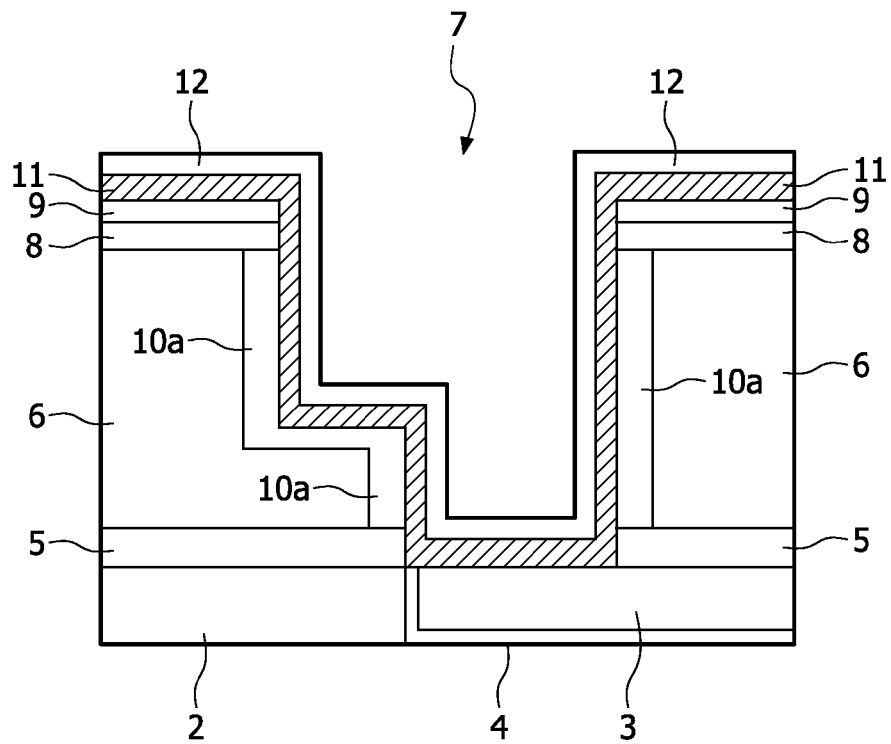

Following the formation of the conductive barrier layer 11, the part formed damascene structure 1 is completed as follows. First, as illustrated in FIG. 4, a metal seed layer 12, preferably Cu, is deposited over the conductive layer 11. The seed layer 12 may be deposited in a known way, for example, using PVD, CVD or ALD.

Figure 5:
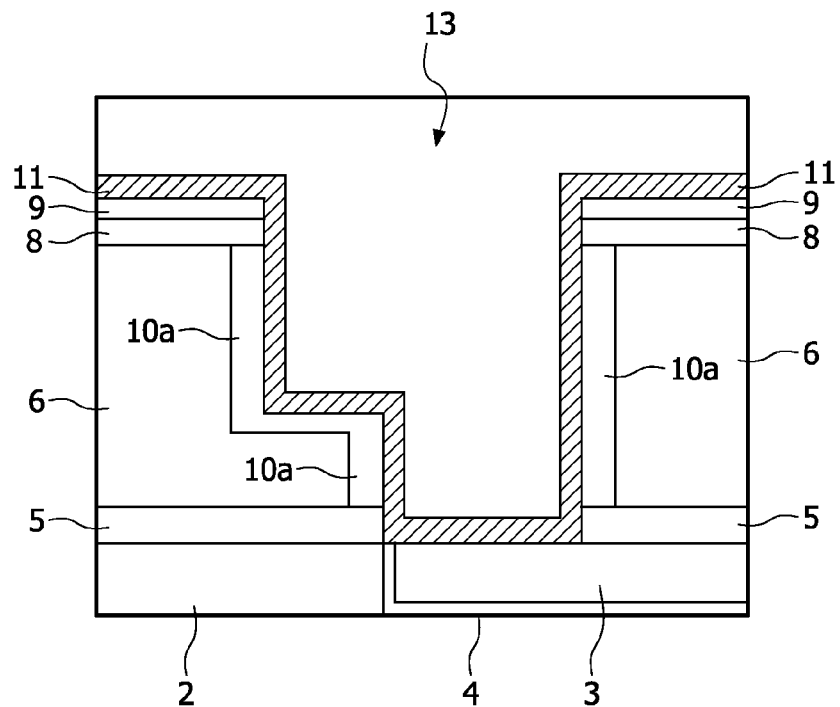

Then, as illustrated in FIG. 5, the passage 7 is entirely filled with a second metal layer 13, preferably Cu, using electro chemical plating.

Figure 6:
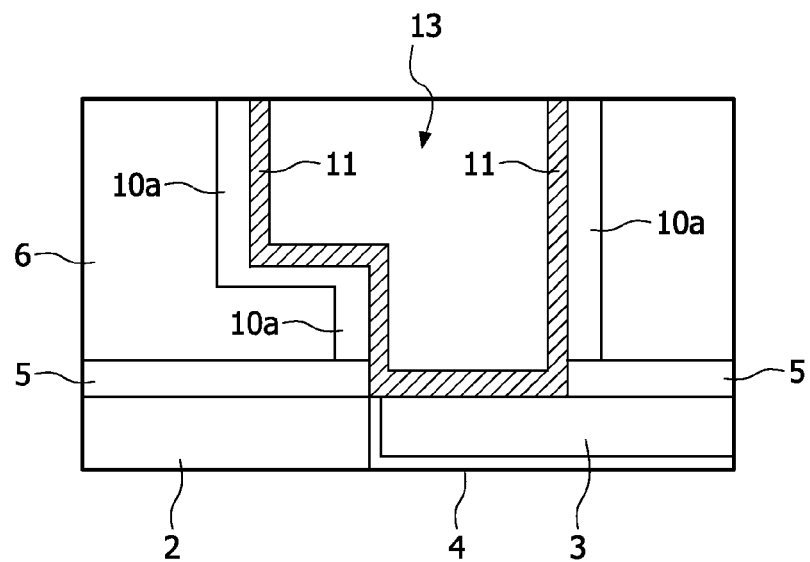
Figure 7:
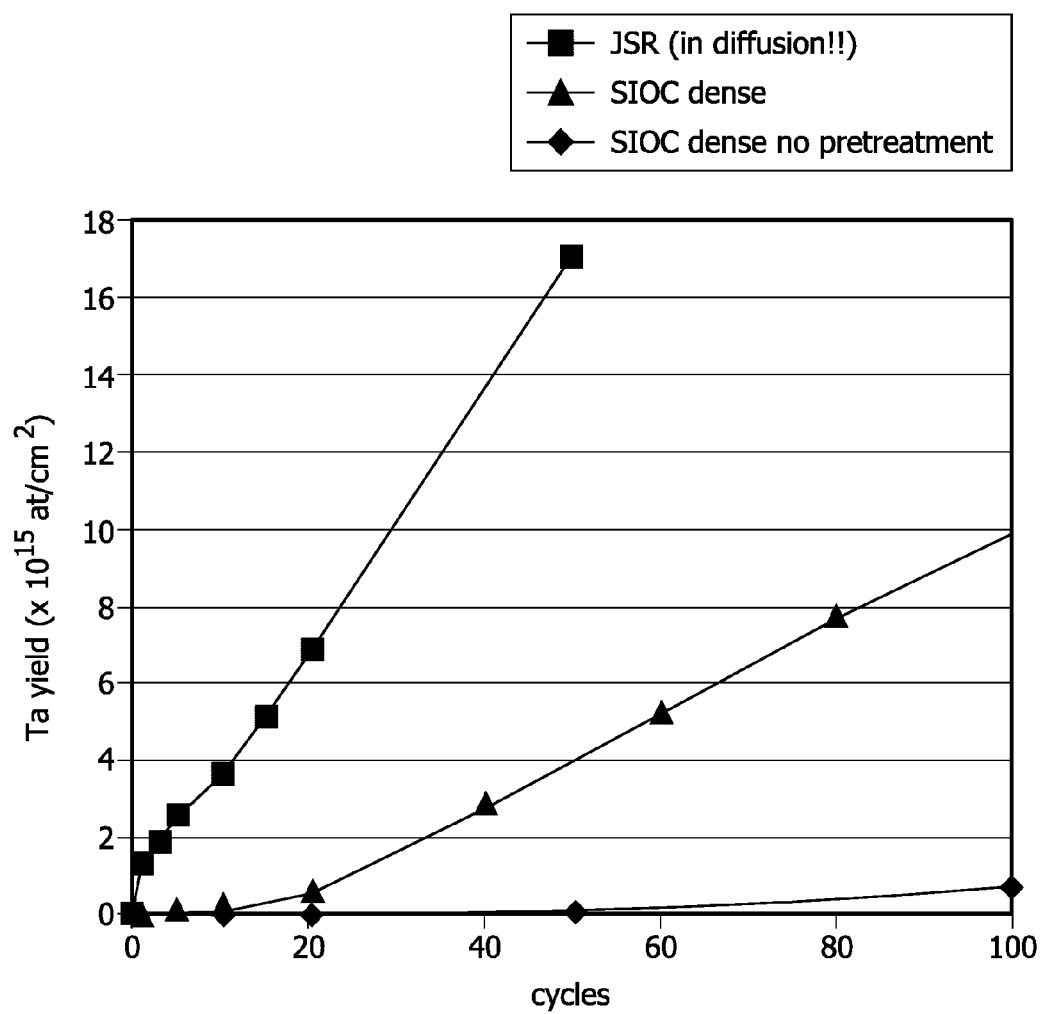
FIG. 7 is a graph showing an amount of deposited TA as a function of deposition cycles in a deposition process.

Next, as illustrated in FIG. 6, upper layers are removed using Chemical Mechanical Polishing (CMP) to form a completed structure.

In a preferred embodiment, the non-conductive layer 10 comprises dielectric $Ta_3N_5$ and is formed by depositing tantalum nitride using ALD. This process will now be discussed in more detail.

ALD is based on alternating pulses of two or more precursors separated from each other by a purge pulse consisting of an inert gas. By reactive adsorption to the surface, growth occurs in a mono-layer by mono-layer fashion. During each pulse the growth is self-limiting by complete occupancy of active sites. The consequences are twofold: 1) A very uniform and conformal growth behaviour is obtained, 2) The mono-layer by monolayer growth behaviour allows full control over the total stack thickness just by setting the amount of cycles.

By installing a third precursor line ternary layers or multi-layered stacks can be deposited easily. Deposition occurs already at low temperatures due to the use of very reactive precursors in contrary to the CVD method where less reactive reactants are introduced in the reaction chamber simultaneously. Hence additional advantages are 1) a low thermal load resulting in low stress, 2) low contamination levels because reaction products are completely removed from the surface during each pulse sequence.

In a preferred embodiment the deposition the of $Ta_3N_5$ is carried out by using pentakis di-methyl amido tantalum (PDMAT) and ammonia ($NH_3$) as precursors at a deposition temperature of 250-275° C. The ALD technique is based on the principle that the gaseous reactants used in the CVD process are made to react with the wafer surface one at the time. The deposition sequence is as follows. A suitable apparatus for performing the deposition is described in WO02/063677.

In a first step, one of the reactants is introduced in the reaction chamber. This precursor reacts with the surface such that a chemical bonding with the substrate atoms takes place. The conditions in terms of temperature, pressure, etc. are selected such that only one monolayer of new material is grown on the surface; condensation or decomposition of additional precursor material does not take place under the chosen conditions. The precursor flow is maintained long enough such that the chemisorbed monolayer is present everywhere on the surface, also in deep vias, around corners, etc. The chemisorbed monolayer results in a new surface termination, characteristic for the specific precursor used. E.g. the surface termination of a silicon dioxide surface consists of Si—OH groups. When this surface is exposed to PDMAT vapor, Si—O—Ta(N—$(CH_3)_2)_x$ bonds will be formed and a dimethyl amine group will be released.

In a second step, an inert purge gas is introduced that removes all gaseous precursor molecules (i.e. PDMAT) used in the first step. The purge gas, e.g. $N_2$ or Ar, is kept flowing sufficiently long to ensure a complete removal of the first type of precursor. As the monolayer grown in the first step is chemisorbed, the purge gas will not remove this layer.

In a third step, a second precursor is introduced. The type of precursor (i.e. $NH_3$ in this example) is selected such that it reacts with the monolayer grown in the first step to form an additional layer. In the ALD TaN example, this leads to the formation of gaseous amines $(CH_3)_2$—NH, while the surface now has a —O—Ta—$NH_2$ termination. Again, the reaction will proceed until all available —(N—$(CH_3)_2$) ligands on the Si—O—Ta(N—$(CH_3)_2)_x$ surface sites are replaced by —Ta—$NH_2$ groups. Also in this step, the flow of reactant gas is kept going long enough to ensure that all surface sites have reacted; at the same time, the conditions are such that no condensation takes place.

A fourth step is another purge with inert gas that removes all excess gas remaining from the third step.

In a fifth step, the first precursor is introduced again (i.e. PDMAT). This precursor reacts with the molecules chemisorbed in the third step, i.e. with the —Ta—$NH_2$ groups. This results in the formation of gaseous amines, and a surface terminated with N—Ta(N—$(CH_3)_2)_x$ groups.

In the continuation of the deposition process each of the four basic steps is repeated many times, until a $Ta_3N_5$ film with the desired thickness has been realized. In summary, the basic principles are (mainly) two-fold: firstly, each of the precursors is brought into contact with the surface long enough, to guarantee a uniform growth of one monolayer everywhere on all substrates present in the reactor. Secondly, the gaseous reactants participating in the chemical reaction are never present in the reaction chamber at the same time.

Tantalum nitrides are known as refractory materials that do not show formation of intermetallic Cu compounds making them a good choice of material from a diffusion barrier perspective. Upon depositing tantalum nitride from the vapour phase, the non-conductive $Ta_3N_5$ phase is always obtained. The formation of this dielectric phase is independent of the Ta precursor choice (metal-organic or halide). It is very difficult to reduce by chemical means the $Ta^{5+}$ oxidation state in the precursor molecules into the $Ta^{3+}$ oxidation state. The reducing power of ammonia ($NH_3$) is simply too small. However, the isolating $Ta_3N_5$ phase can be transformed by a soft argon plasma treatment into the conductive TaN phase. This is important when a low resistive connection has to be made to the metal level above.

The effect of the argon plasma on the $Ta_3N_5$ film composition has been studied using X-ray Fluorescence. The Ta/N ratio was reduced from 1.6 to 1.1 by applying a 120 sec Ar plasma at 300 W AC bias. The resistivity of the barrier film was significantly reduced as was evidenced by parametrical test results on via chains.

The use of a $Ta_3N_5$ barrier provides other advantages. First, the ALD $Ta_3N_5$ films are nanocrystalline/amorphous which is preferred above the columnar grains which are normally observed during PVD or ALD growth of other materials (e.g. PVD Ta/TaN or ALD TiN). Secondly, the films are nitrogen rich which improves significantly the diffusion barrier properties against copper.

The deposition of ALD $Ta_3N_5$ from metal organic precursors like PDMAT is much more attractive than halide chemistries that are commonly used in the ALD TiN or ALD WNC processes. The bulky metal organic ligands help to avoid massive diffusion into the low-k material if the pore size of the ULK dielectric is not too large. Moreover, it is known that the use of halide chemistries causes serious problems in integration. It is known that the single use of $WF_6$ is problematic in combination with $SiO_2$ surface types due to possible etching of the $SiO_2$ (e.g. hardmask). In addition, generation of volatile Cu reaction products does not occur when growing TiN on a Cu surface. As an example, the use of chlorine causes severe Cu contamination problems reactants in the ALD TiN process.

Preferably, the liner thickness used to close the pores, is at least half the diameter of the pore opening. Precursor penetration into the ULK will stop when the neck opening becomes smaller as the size of the molecule. For current ULK materials the maximum in the pore size distribution lines around 2 nm with a maximum pore size smaller than 4 nm. Hence, the deposition of 2 nm ALD barrier film will be sufficient to close the pores.

One disadvantage of this approach is that diffusion of the precursors can still take place into the porous dielectric. Massive deposition of material inside the ULK should be avoided as the permittivity of the ULK may otherwise be jeopardized. In the case of ALD and CVD liner deposition the diffusion can be minimized if very bulky metal organic precursors are used that have a larger size than the pore diameter. Also the reactivity of the inner and outer surface of the ULK plays a role and should be tailored in such way that chemisorption does not occur inside. Low permittivity materials should contain as many as possible Si—H or Si—$CH_3$ bonds and almost no dangling Si—OH bonds. as chemisorption will not occur on Si—H or Si—-$CH_3$ bonds.

This won't prevent diffusion into the ULK but it will prevent massive deposition inside the ULK.

FIG. 6 illustrates the total deposited amount of tantalum as a function of applied number of cycles on a dense CVD SiOC film. Large differences in growth per cycle are observed during the initial stages of growth depending on the actual number of "bonding surface states". In the case of $Ta_3N_5$ deposition on a porous low-k (e.g. JSR 5109, a spin-on SiOC material with a large pore-size) four times as much material is deposited than on a dense CVD SiOC material due to the increased surface area. However, the amount of Ta that is deposited on a dense SiOC surface is 10 to 20 times smaller if no plasma pre-treatment of the surface is performed.

Although the available surface area is far more as 10000 times as large compared to a dense surface, the deposited amount of material inside the ULK remains limited. This is due to the relative small number of Si—OH groups in the structure. In this example the JSR spin-on ULK has an interconnected pore structure with an average pore-size of 3.4 nm. If the surface gets closed, the growth per cycle on the ULK film becomes equal to the growth per cycle on a dense film. FIG. 6 shows that after 50 cycles the surface is not closed yet because the slopes of the growth curves are not yet identical (i.e. still some material is deposited inside).

Regarding the desired liner deposition near the outer surface of the porous dielectric, the outer surface should be made more reactive than the inner surface. This, for instance, can be achieved by a proper plasma treatment prior to ALD deposition Increasing the reactivity of the surface (by the formation of Si—OH bonds) will cause the molecules to stick and bond immediately. Consequently, this leads to preferential deposition near the surface. In addition, the nucleation behaviour will improve due to a larger density of active groups resulting in an early closure of the growing film. If the initial density of active surface groups is small, an island-like type of growth behavior will occur. It will take a large number of cycles before the islands touch each other. The application of an argon or a hydrogen plasma can enhance the number of initial adsorption sites.

The advantages of using a non-conducting diffusion barrier are threefold. First, the insulating properties of the inter-metal dielectric are not affected if any material deposition occurs inside the low-k material and hence leakage current related problems are avoided. Secondly, the copper volume in the trenches is maximised due to a minimal consumption of space resulting in lower copper resistance. For instance, the combination of a dielectric liner and a PVD copper diffusion barrier will reduce the effective copper line width by about 10%-20% for the 45 nm node. The transformable liner need only have a thickness necessary for pore sealing which is typically 2-5 nm. Below 100 nm line widths the reduction of barrier thickness becomes an important parameter, as a line width increase of 10-20% improves the Cu resistance by about 50%. Thirdly, a barrier that can be transformed into a conductive material is preferred above a dielectric barrier that has to be removed afterwards for the fabrication of low resistive vias and via-chains. With conventional dielectric liner deposition (e.g. SiC) an etch-step has to be performed to open up the via bottom and remove the dielectric liner. This etch step is necessarily mask-less at this stage in the integration. Hence, it is very difficult to avoid complete etching of the liner on the field if the via bottom has to be opened completely (if possible there is only a very small process window). If the etch is not controlled well, line and via dimensions could dramatically deteriorate resulting in lower yields and poor electrical performance.

Having thus described the present invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements.

It will be apparent for a person skilled in the art that the claimed and described embodiments may be combined without departing from the scope of the invention.

The invention claimed is:

1. A method of manufacturing a structure for a semiconductor device, the method comprising:
  forming a non-conductive barrier layer over a first material, the first material being a porous material;

treating the non-conductive barrier layer to transform an upper portion thereof into a conductive layer while a lower portion thereof that underlies the upper portion remains non-conductive.

2. A method according to claim 1, wherein material from the non-conductive barrier layer penetrates pores of the porous material and defines the lower portion that remains non-conductive when the upper portion of the barrier layer is transformed into a conductive layer.

3. A method according to claim 1, wherein the first material is a dielectric.

4. A method according to claim 3 wherein the first material is an ultra low k material.

5. A method according to claim 1, wherein the non-conductive barrier layer comprises $Ta_3N_5$.

6. A method according to claim 1, wherein the upper portion transformed into a conductive layer comprises TaN.

7. A method according to claim 1, wherein the non-conductive barrier layer is deposited using ALD and/or CVD.

8. A method according to claim 1, wherein the upper portion is transformed into a conductive layer by plasma treatment.

9. A method according to claim 8 wherein the upper portion is transformed into a conductive layer by Ar ion bombardment.

10. A method according to claim 1, wherein a second material is deposited over the upper conductive layer.

11. A method according to claim 10 wherein the second material is metallic.

12. A method according to claim 11 wherein the second material is copper.

13. A method according to claim 1, wherein the first material is a dielectric that defines a passage and the non-conductive layer is formed on a wall(s) of the passage, the method further comprising also forming the non-conductive layer over a first metal region that closes an end of the passage, and after transforming the upper portion into a conductive layer, forming a second metal region in the passage such that the first and second metal regions are in electrical contact via the conductive layer.

14. A method according to claim 13, wherein the dielectric first material is porous and material from the non-conductive barrier layer penetrates pores of the porous material and remains non-conductive when the upper portion of the barrier layer is transformed into the conductive layer.

15. A structure for a semiconductor device, the structure comprising: a barrier layer formed on a first material, the barrier layer comprising a lower region comprising an insulating material and an upper region overlying the lower region and comprising a conducting material derived from the insulating material; and wherein the first material is a porous material and the lower region comprises matter from the barrier layer that has penetrated pores of the porous material.

16. A structure according to claim 15 wherein the first material is dielectric.

17. A structure according to claim 15, wherein the non-conducting region comprises $Ta_3N_5$.

18. A structure according to claim 15, wherein the conducting region comprises TaN.

19. A structure according to claim 15, wherein the first material is an ultra low k material.

20. A structure according to claim 15, wherein a second material is deposited over the upper region.

21. A structure according to claim 20 wherein the second material is metallic.

22. A structure according to claim 21 wherein the second material is copper.

23. A structure according to claim 15, wherein the first material is a dielectric that defines a passage and the barrier is formed on a wall(s) of the passage, the structure further comprising a layer of conducting material derived from the insulating material formed over a first metal region that closes an end of the passage, and a second metal region formed in the passage and wherein the first and second metal regions are in electrical contact via the layer of conducting material.

24. A structure according to claim 23, wherein the dielectric first material is porous and wherein the lower region comprises insulating material that has penetrated pores of the porous material.

* * * * *